United States Patent [19]

Kimata et al.

[11] Patent Number: 4,707,744
[45] Date of Patent: Nov. 17, 1987

[54] SOLID-STATE IMAGE SENSOR

[75] Inventors: Masafumi Kimata; Masao Yamawaki; Satoshi Yamakawa, all of Itami, Japan

[73] Assignee: Mitsubishi Denki Kabushiki Kaisha, Tokyo, Japan

[21] Appl. No.: 894,022

[22] Filed: Aug. 7, 1986

[30] Foreign Application Priority Data

Aug. 13, 1985 [JP] Japan .................. 60-179648

[51] Int. Cl.$^4$ ............................... H04N 3/14
[52] U.S. Cl. ................... 358/213.26; 358/213.29; 358/213.31
[58] Field of Search ............ 358/213.15, 213.18, 358/213.26, 213.29, 213.31; 357/30 H, 212

[56] References Cited

U.S. PATENT DOCUMENTS

| 4,117,514 | 9/1978 | Terui et al. | 358/213.26 |
| 4,455,575 | 6/1984 | Murakoshi | 358/213.18 |
| 4,514,765 | 4/1985 | Miyata et al. | 358/213.18 |
| 4,514,766 | 4/1985 | Koike et al. | 358/213.29 |
| 4,602,289 | 7/1986 | Sekine | 357/30 H |
| 4,638,361 | 1/1987 | Takeshita | 358/213.31 |

FOREIGN PATENT DOCUMENTS 60-109271 10/1985 Japan.
2065974 7/1981 United Kingdom.

OTHER PUBLICATIONS

A technical report of the Television Society, No. TEBS 101-6 ED841, 'A ½" Image Sensor with a Charge Sweep Device', by Kimata et al. (Japan).

"A 480×400 Element Image Sensor with a Charge Sweep Device", ISSCC, Digest of Technical Papers, 1985, pp. 100–101, by M. Kimata et al.

"A ½" Format Color Image Sensor with 485×510 Pixels", Technical Digest of Electronic Imaging, 85, 1985, pp. 91–94, by M. Yamawaki et al.

Kimata et al., *A 480×400 Element Image Sensor with a Charge Sweep Device*, pp. 100–101, IEEE International Solid-State Circuits Conference.

Primary Examiner—Gene Z. Rubinson
Assistant Examiner—Stephen Brinich
Attorney, Agent, or Firm—Lowe, Price, LeBlanc, Becker & Shur

[57] ABSTRACT

A solid-state image sensor including pixels including photodetectors (111–148) for detecting light signals and charge sweep devices (210–240) for transferring signal charges. The pixels are arranged in first and second directions orthogonal to each other. A transfer gate scanning circuit (600) sequentially selects a pixel row from a plurality of pixel rows arranged in a second direction. A charge sweep device scanning circuit (700) supplies readout signals to the selected pixel rows so that signal charges may be read out, a plurality of times, within a horizontal scanning interval from the photodetectors (111–148).

3 Claims, 7 Drawing Figures

SOLID-STATE IMAGE SENSOR

BACKGROUND OF THE INVENTION

1. Field of the Invention

The present invention relates to a solid-state image sensor, and more particularly to a solid-state image sensor using a charge sweep device for vertical charge transfer.

2. Description of the Prior Art

FIG. 1 is a block diagram of a conventional solid-state image sensor of a CSD (Charge Sweep Device) system shown in, for example, an article by M. Kimata et al., entitled "A 480×400 Element Image Sensor with a Charge Sweep Device," ISSCC, Digest of Technical Papers, 1985, pp. 100-101, an article by M. Yamawaki et al., entitled "A½" FORMAT COLOR IMAGE SENSOR WITH 485×510 PIXELS," Technical Digest of Electronic Imaging 85, 1985, pp. 91-94, and a technical report of the Television Society No. TEBS 101-6, ED 841 (Kimata et al.).

In FIG. 1, a conventional solid-state image sensor comprises photodetectors 111-148, CSDs 210-240 for vertical charge transfer, an interface section 300, a horizontal CCD 400, an output pre-amplifier 500, a transfer gate scanner 600, a CSD scanner 700, and interconnections 801-808.

The photodetectors 111-148 store signal charges corresponding to light signals irradiated. The charge sweep devices 210-240 transfer the signal charges from the photodetectors 111-148 in a vertical direction, respectively, the respective gates of the charge sweep devices including transfer gates as described below.

One pixel comprises a photodetector and a gate of the charge sweep device. The interface section 300 temporarily stores charges transferred by the charge sweep devices 210-240, and controls the transfer of the signal charges to the horizontal CCD 400. The transfer gate scanner 600 generates selection signals for indicating the selection of a transfer gate from a plurality of transfer gates included in a vertical line. The CSD scanner 700 supplies CSD driving signals to the charge sweep devices 210-240. Each gate of the charge sweep devices 210-240 is connected to each other by the interconnections 801-808. Both signals from the transfer gate scanner 600 and signals from the CSD scanner 700 are supplied to the respective gates of the charge sweep devices 210-240 by the interconnections 801-808.

FIG. 2 is a diagram showing in detail the construction of a pixel 100 as depicted in FIG. 1. In FIG. 2, a photodetector 125 includes a PN junction formed of a portion of a semiconductor substrate area and an area having a conductivity type different from that of the semiconductor substrate and a high impurity concentration. A gate 225 is one of the gates of a charge sweep device 220, a partial area 1 thereof being a transfer gate of a surface channel. An aluminum interconnection 805 is connected through a contact hole 3 to the gate 225. The area 2 is the charge sweep device of a buried channel.

FIG. 3 is a diagram showing a gate structure of a cross section of a solid-state image sensor taken along lines B—B' shown in FIG. 1 and also showing channel potentials.

Now, referring to FIGS. 1 to 3, the operation of a conventional solid-state image sensor is described. In FIG. 3, gates 221-228 are respective gates of a charge sweep device 220. An storage gate 321 and a storage control gate 322 comprise an interface section 300.

First, it is assumed that the respective potentials of the respective gates 221-228 of the charge sweep device 220 are "H","H","L","L","H","H","L" and "L" levels (H is high, and L is low). Then, the output of a CSD scanner 700 is rendered the high impedance state. In such a condition, a transfer gate, for example a gate 222, is rendered a "HH" level (higher than a "H" level) in a vertical line by driving a transfer gate scanner 600. At this "HH" level, it is possible to read out singal charges.

In FIG. 3, since a selection signal is applied to the gate 222, the signal charges of a photodetector 122 are read out (FIG. 3(a)). A CSD is divided into many small potential wells, and the signal charges read out from the photodetector are stored in a plurality of potential wells. For example, a signal charge is divided into Qs1, and Qs2, and transferred.

Then, the transfer gate scanner 600 is rendered the high impedance state, and subsequently, driving of a CSD is initiated. This driving is identical to that in an ordinal four-phase driving CCD. That is, the potentials at the gates 221-228 are "H", "H", "L", "L", "H", "H", "L" and "L" levels in the state shown in FIG. 3(b), which sequentially charge into "L", "H", "H", "L", "L", "H", "H" and "L" levels, "L", "L", "H", "H", "L", "L", "H" and "H" levels, "H", "L", "L", "H", "H", "L", "L" and "H" levels, and "H", "H", "L", "L", "H", "H", "L" and "L" levels corresponding to the state shown in FIG. 3(c).

By repeating this cycle, the signal charges are transferred to the storage gate 321, as shown in FIGS. 3(c)-3(e).

Finally, the potential of the storage control gate 322 becomes a "H" level, and the potential of the storage gate becomes a "L" level within a horizontal blanking interval, causing the signal charges to be transferred from the storage gate 321 to a horizontal CCD 400 as shown in FIG. 3(f). By repeating the above operation, the signal charges of all pixels are read out.

If transfer efficiency of the CSDs is insufficient, a charge Qr is left in a potential well, as shown in FIG. 3(d) Such left charge Qr can be added to a main signal within the storage gate by driving CSDs more times than the number of clock cycles necessary for sweeping the singal charges.

In a conventional solid-state image sensor, particularly including photodetectors formed by PN junction, the resistance value of transfer gates is increased as signal charges are read out, causing the transfer of the signal charges from a photodetector 125 to the charge sweep device area 2 to be imperfect. Since the solid-state image sensor using conventional CSDs have read out the charges from the photodetector 125 to the charge sweep device area 2 only one time within a horizontal scanning interval, they have encountered a difficulty in which lags would be created if the transfer of the signal charges became imperfect as described above.

SUMMARY OF THE INVENTION

A principal object of the present invention is to provide a solid-state image sensor which can reduce lags sufficiently even if the transfer of signal charges from a photodetector to the charge sweep device area is imperfect.

In summary, the present invention comprises: pixels including light signal detection means for detecting light signals and charge transfer means for transferring signal charges, said pixels being arranged in first and second directions orthogonal to each other; readout command means for sequentially selecting a pixel row from a plurality of pixel rows arranged in said second direction to provide a command for readout of the signal charges; and signal supplying means for supplying readout signals to the pixel row which has been commanded by said readout command means so that the signal charges may be read out from said light signal detection means a plurality of times within a horizontal scanning interval, and for supplying transfer signals to the pixel rows which have not been commanded by said readout command means so that the signal charges may be transferred by said charge transfer means.

According to the present invention, it is possible to reduce the lags created based on the imperfect transfer, by increasing frequency for reading out signal charges from photodetector means within a horizontal scanning interval.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
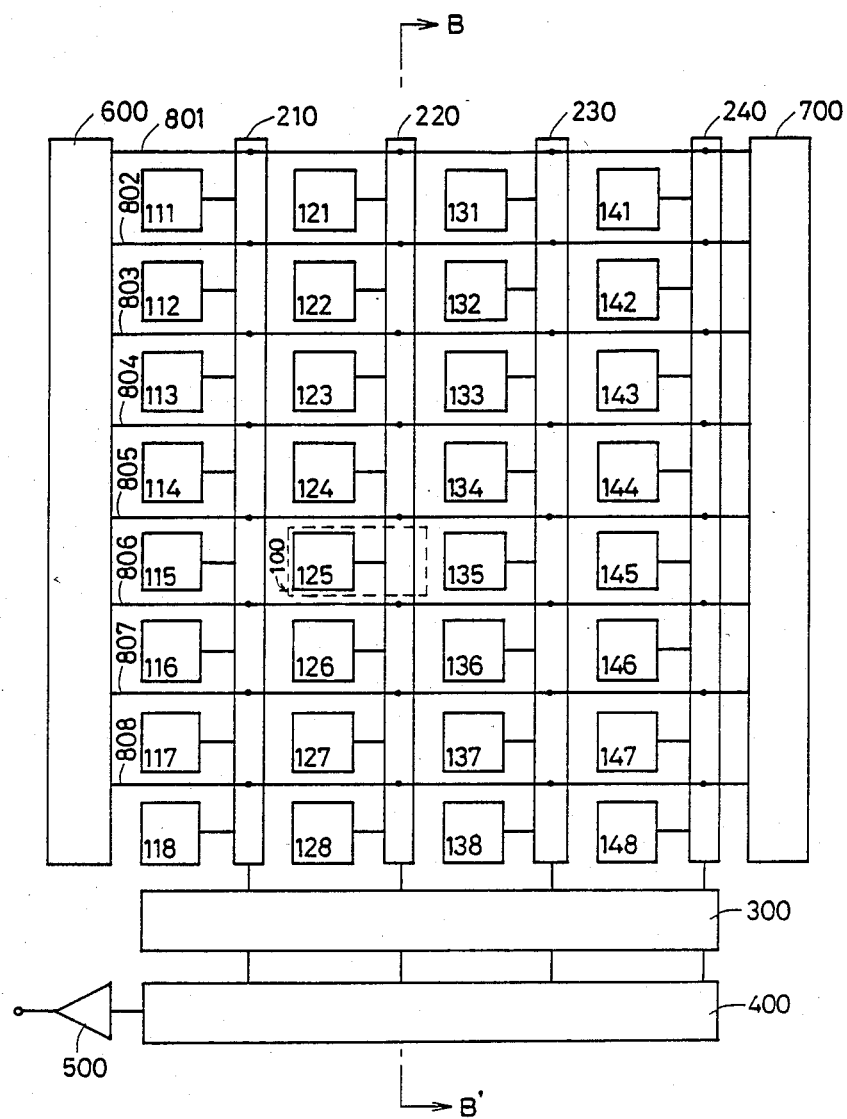
FIG. 1 is a diagram showing a schematic construction of a conventional solid-state image sensor.
Figure 2:
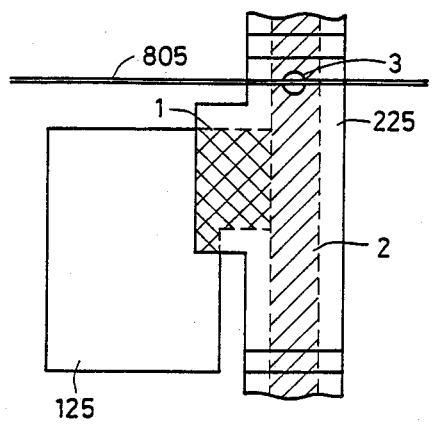
FIG. 2 is a diagram showing a construction of pixels depicted in FIG. 1.
Figure 3:
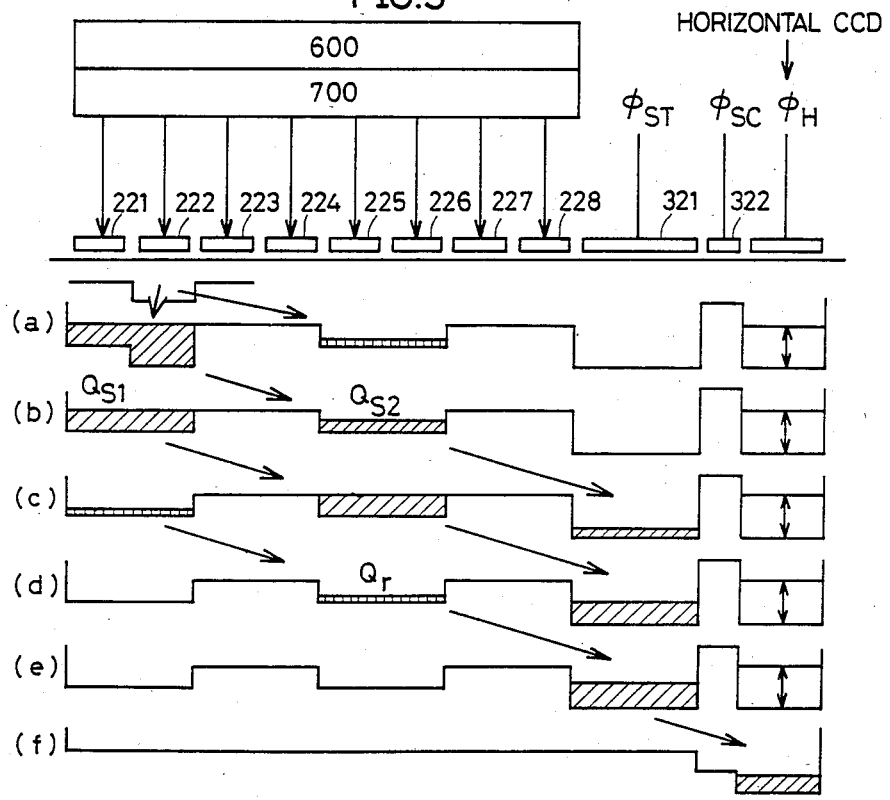
FIG. 3 is a diagram showing a gate structure of a charge sweep device depicted in FIG. 1 and channel potentials associated with the gate structure.
Figure 4:
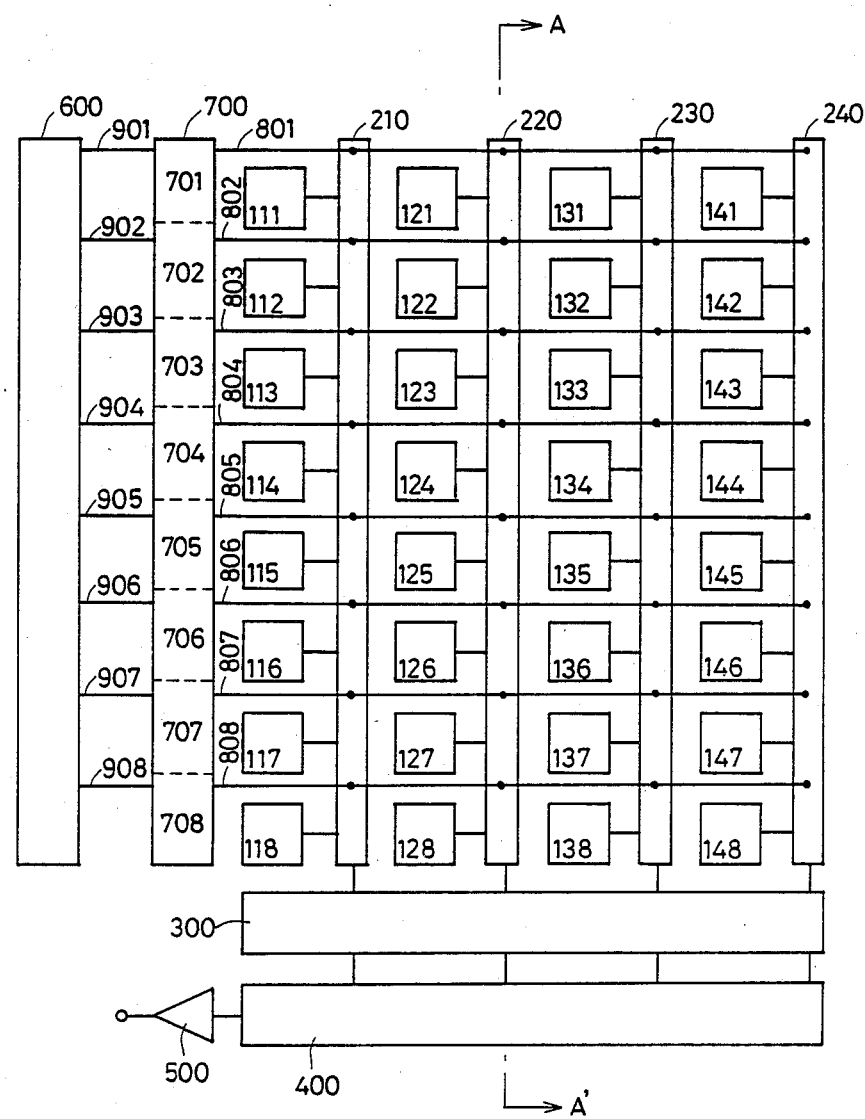
FIG. 4 is a diagram showing a schematic construction of a solid-state image sensor applying an embodiment of the present invention.

FIG. 4 is a schematic diagram of construction applying one embodiment of the present invention. In FIG. 4, except for arrangement and interconnections 901–908 of a transfer gate scanner 600 and a CSD scanner 700, the construction is identical to the conventional construction shown in FIG. 1. Therefore, the same portions are indicated by the same reference numerals and explanation thereof is omitted.

Conventionally, signals are separately and independently applied to a transfer gate scanner 600 and a SCD scanner 700. However, according to the present embodiment, the output of the transfer gate scanner 600 is applied through the interconnections 901–908 to the CSD scanner 700. The CSD scanner 700 comprises portions 701 to 708 each corresponding to each pixel row.

Figure 5:
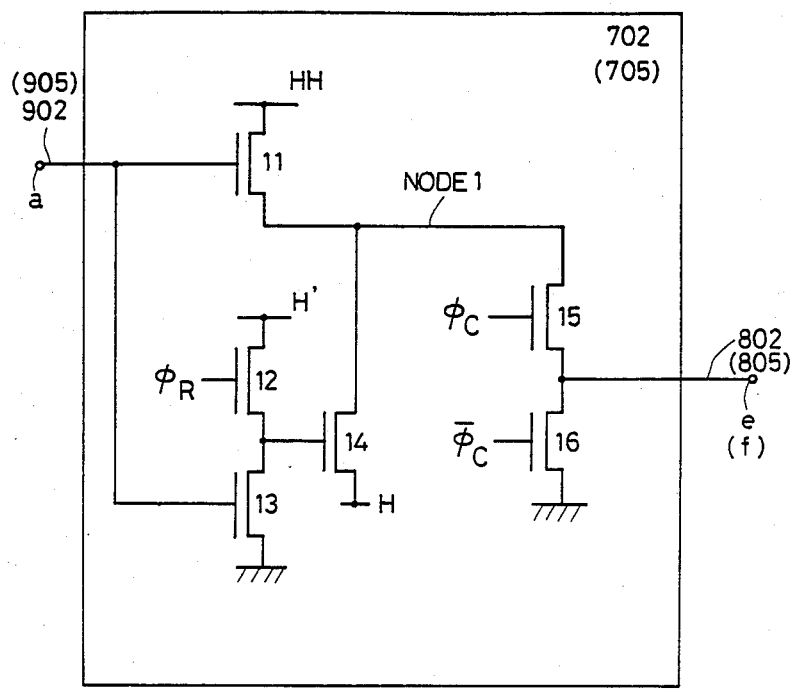
FIG. 5 is a diagram showing a construction of a CSD scanner depicted in FIG. 4.
Figure 6:
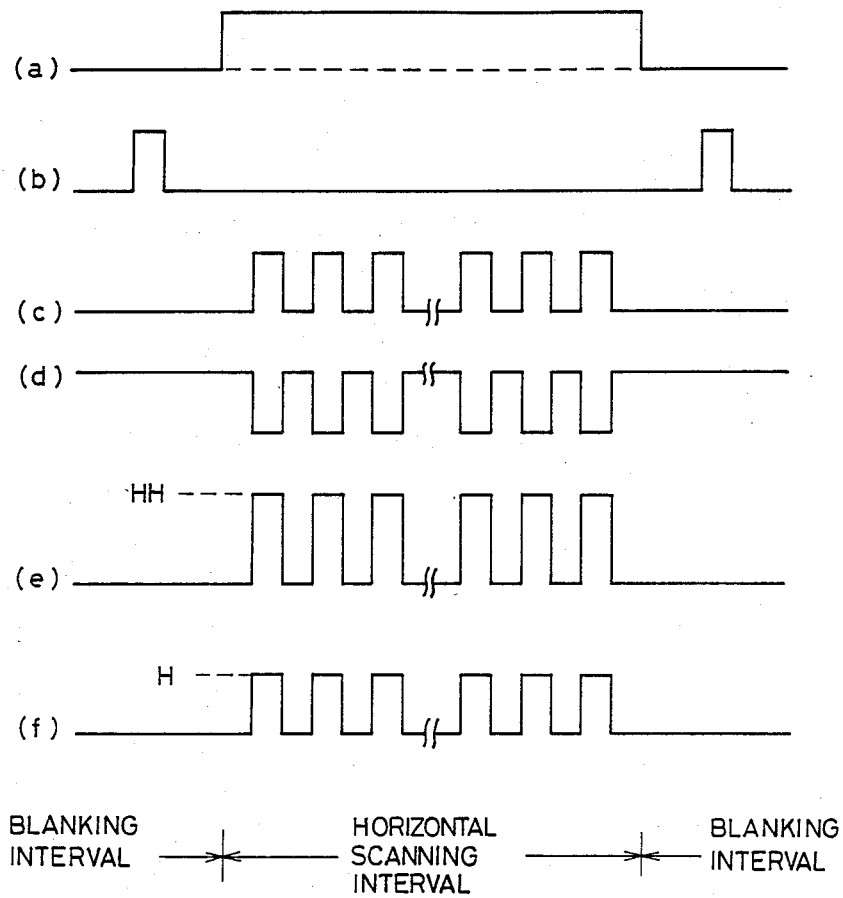
FIG. 6 is a diagram showing waveforms of CSD scanner depicted in FIG. 5.
Figure 7:
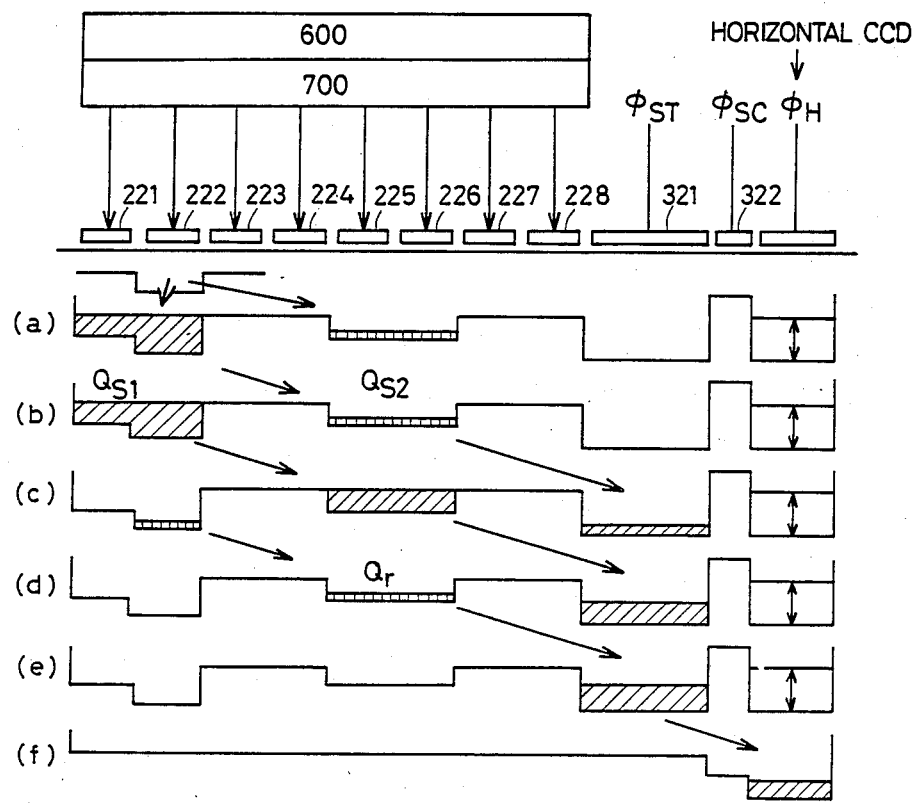
FIG. 7 is a diagram showing a gate structure of a charge sweep device depicted in FIG. 4 and channel potentials associated with the gate structure.

FIG. 5 is a diagram showing an electric circuit of a CSD scanner 700 comprising enhancement type MOS transistors 11–16. FIG. 6 is a diagram showing waveforms of a single CSD scanner 702 or 705 depicted in FIG. 5. FIG. 7 is a diagram showing a gate structure of a charge sweep device shown in FIG. 4 and channel potentials associated with the gate structure.

Now, referring to FIGS. 4 to 7, the operation of a solid-state image sensor of one embodiment of the present invention is described. The transfer gate scanner 600 shown in FIG. 4 is constructed identically to that of the prior art, and only one of the interconnections 901–908, such as an interconnection 902, is made to be at a high level (selected state), and the others at a low level.

First, the operation of a single CSD scanner 702 to which the high level output is applied from the transfer gate scanner 600 is described. As shown in FIG. 6(a), since the output of the interconnection 902 is at a high level within a horizontal scanning interval, transistors 11 and 13 shown in FIG. 5 become the on-state. This causes a transistor 14 to become the off-state, and a node 1 to become a "HH" level. However, since the output of the transfer gate scanner 600 is sufficiently high, the transistor 11 is adapted to be held in the on-state even if a node 1 is rendered a "HH" level. Since signals for driving the CSD scanner 702, such as four-phase clock signals $\phi c$ (FIG. 5(c)) and $\bar{\phi} c$ (FIG. 5(d)), are supplied within a horizontal scanning interval, the output of an interconnection 802 shown in FIG. 6(e) becomes a "HH" level when $\phi c$ becomes a high level, and a "L" level when $\phi c$ becomes a low level.

Next, the operation of the other CSD scanners 701 and 703–708 to which the low level output is applied from the transfer gate scanner 600 is described.

As shown by a dotted line in FIG. 6(a), for example, since the output of an interconnection 905 is at a low level within a horizontal scanning interval, the transistors 11 and 13 become the off-state. The $\phi_R$ shown in FIG. 6(b) is a clock signal which turns a transistor 12 on during a blanking interval after reading out a horizontal line. When $\phi_R$ becomes a high level, and the transistor 12 is turned on, a transistor 14 becomes the on-state, and a node 1 becomes a "H" level. Since the state of this "H" level is held even if $\phi_R$ becomes a low level, the output of an interconnection 805 shown in FIG. 6(f), within a horizontal scanning interval, becomes a "H" level when $\phi c$ becomes a high level, and a "L" level when $\phi c$ becomes a low level.

In the potentials of gates 221–228 shown in FIG. 7, only the output 902 of the transfer gate scanner 600 corresponding to, for example, the gate 222 becomes at a high level, and the outputs 901 and 903–908 becomes a low level. Thus, the gate potentials 221–228 of a charge sweep device 220 are at "H", "HH", "L", "L", "H", "H", "L" and "L" levels, in order (FIG. 7(a)). Then, according to driving of a CSD, the respective gate potentials sequentially becomes "L", "HH", "H", "L", "L", "H", "H" and "L" level, "L", "L", "H", "H", "L", "L", "H" and "H" levels, "H", "L", "L", "H", "L", "L" and "H" levels, and "H", "HH", "L", "L", "H", "H", "L" and "L" levels corresponding to the state shown in FIG. 7(c). Thus, a gate 222 becomes a "HH" level in each cycle of the CSD driving, and signal charges left unread are read out each time a gate 222 becomes a "HH" level, causing the lags to be reduced.

Further, although, in the embodiment described above, a gate 222 is rendered a "HH" level per each cycle of driving of a CSD, this is not intended to be limited. For example, a part of all cycles may be rendered a "HH" level.

Even in the embodiment described above, CSDs may be driven more times than the number of clock cycles necessary for sweeping the signal charges to improve CSD transfer efficiency, similarly to the prior art. Although, in the embodiment described above, the CSDs has been driven in a manner similar to four-phase driving CCDs, this is not intended to be limited. For example, the CSDs may be driven by any phase driving signals. In addition, although, in the embodiment described above, an n-channel device has been described, a p-channel device may be used with the same effect.

Although the above described embodiment fails to describe an interlace, it is possible to provide an interlace circuit within the transfer gate scanner 600, similarly to the prior art. In addition, photodetectors may use Schottky junction and the like, other than PN junction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor, comprising:
   pixels arranged in first and second directions orthogonal to each other and including light signal detection means (111-148) for detecting light signals, respectively, and charge transfer means (210-240) for transferring in said first direction signal charges read out from said light signal detection means,
   readout command means (600) for sequentially selecting a pixel row from a plurality of pixel rows arranged in said second direction to provide a readout command for readout of the signal charges, and
   signal supplying means (700) for supplying readout signals to the pixel row which has been commanded by said readout command means so that the signal charges may be read out from said light signal detections means a plurality of times within a horizontal scanning interval, and for supplying transfer signals to the pixel rows which have not been commanded by said readout command means so that the signal charges may be transferred by said charge transfer means (210-240).

2. A solid-state image sensor in accordance with claim 1, wherein said signal supplying means (700) comprises:
   readout signal generating means for generating said readout signals when the readout command is provided from said readout command means, and
   transfer signal generating means for generating said transfer signals when the readout command is not provided from said readout command means.

3. A solid-state image sensor in accordance with claim 1 wherein:
   said transfer signal generating means alternately generates, a plurality of times, signals having a first potential level and signals having a higher potential level than the first potential level, and
   said readout signal generating means alternately generates, a plurality of times, the signals of the first potential level and signals having a higher potential level than the second potential level.

* * * * *